(12) United States Patent
Hu et al.

(10) Patent No.: US 6,870,261 B2
(45) Date of Patent: Mar. 22, 2005

(54) DISCRETE CIRCUIT COMPONENT HAVING AN UP-RIGHT CIRCUIT DIE WITH LATERAL ELECTRICAL CONNECTIONS

(75) Inventors: Chih-Liang Hu, Taipei (TW); Wen-Long Chen, Taipei (TW); Pan-Nan Chen, Keelung (TW); Ming-Chong Liang, Taipei (TW); Cheen-Hai Yu, Hsinchu (TW)

(73) Assignee: Comchip Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/248,864

(22) Filed: Feb. 26, 2003

(65) Prior Publication Data

US 2004/0164406 A1 Aug. 26, 2004

(51) Int. Cl.$^7$ ............................. H01L 23/48; H01L 23/36; H05K 1/18; H05K 7/12; H01R 9/00
(52) U.S. Cl. ....................... 257/724; 257/686; 257/685; 257/723; 257/777; 257/684; 257/796; 257/730; 257/725; 257/728; 257/733; 257/678; 257/696; 361/773; 361/772; 361/783; 361/748; 361/807; 439/68; 439/72; 439/78; 439/82; 439/83
(58) Field of Search ..................... 257/724, 686, 257/685, 723, 777, 684, 796, 730, 725, 728, 733, 678, 696, 732, 68 L; 361/733, 772, 783, 748, 807; 439/68, 72, 78, 82, 83

(56) References Cited

U.S. PATENT DOCUMENTS

| | | | | |
|---|---|---|---|---|
| 5,450,289 A | * | 9/1995 | Kweon et al. | 361/773 |
| 5,451,815 A | * | 9/1995 | Taniguchi et al. | 257/696 |
| 5,619,067 A | * | 4/1997 | Sua et al. | 257/686 |
| 5,793,116 A | * | 8/1998 | Rinne et al. | 257/777 |
| 5,801,448 A | * | 9/1998 | Ball | 257/778 |
| 5,940,277 A | * | 8/1999 | Farnworth et al. | 361/760 |
| 6,383,839 B2 | * | 5/2002 | Kinsman | 438/107 |
| 2003/0003705 A1 | * | 1/2003 | Chung et al. | 438/612 |

* cited by examiner

Primary Examiner—Alexander Oscar Williams
(74) Attorney, Agent, or Firm—Jiang Chyun IP Office

(57) ABSTRACT

A discrete circuit component having an up-right circuit die with lateral electrical connections. The component comprises a substrate having a pair of electrically conductive traces, and a circuit die is planted between the pair of consecutive traces, wherein one electrode of the circuit die on the surface thereof vertical to the substrate is electrically bonded to one of the conductive trace immediately next thereto, while the other electrode of the circuit die on the opposite surface thereof vertical to the substrate is electrically bonded to the other of the pair of conductive traces immediately next thereto. A body of electrical insulation material hermetically seals the circuit die, and a pair of surface electrodes formed on the surface of the body of insulation material are each electrically connected to the corresponding one of the pair of electrically conductive traces extending from the circuit die.

17 Claims, 5 Drawing Sheets

US 6,870,261 B2

DISCRETE CIRCUIT COMPONENT HAVING AN UP-RIGHT CIRCUIT DIE WITH LATERAL ELECTRICAL CONNECTIONS

BACKGROUND OF INVENTION

1. Field of the Invention

The present invention relates in general to discrete circuit components and the method of fabrication. In particular, the present invention relates to a structure for discrete circuit components having a lateral-bonding up-right circuit die and the method of fabrication for such discrete components.

2. Description of Related Art

Active and passive discrete circuit components such as diodes, resistors, capacitors and inductors are widely used for the construction of electronic circuits. Regardless of either signal or power, or, linear or digital applications, different types of discrete circuit components are essential for the construction of various electronic circuit systems. Along with their counterparts fabricated inside integrated circuit (IC) devices, diodes, resistors, capacitors and inductors in the form of discrete circuit components are produced and consumed in mass quantities.

Circuit components of the discrete type are available in many different packages. For miniaturization, discrete circuit components produced to the standard of SMT (Surface-Mount Technology) have become the indispensable components in modern electronics industry. SMT discrete components are used for the production of almost all sorts of electronic devices regardless of whether or not they are of miniature designs. Many discrete component structural designs to the SMT standard and their corresponding fabrication methods have thus been developed.

Among the conventional SMT discrete circuit components popularly used nowadays, their efficient automated mass production requirement has led to the development and the adoption of a general structural configuration with lie-down flat circuit die. An SMT discrete component of this type has a basic structure constructed starting with its circuit component die laid flat on the surface of a substrate. Eventually the circuit die is buried in a protective material, with electrical connection means extending out from the terminals of the circuit die on the top and bottom surfaces thereof to the surface electrodes of the SMT component.

However, an SMT discrete circuit component of such a lie-flat die structural configuration has inherent problems. It is relatively more vulnerable to thermal and mechanical stresses arising from both its fabrication and service phases. During the fabrication phase, for example, a circuit component die at its assigned location on the surface of the substrate of a large two-dimensional array (or, matrix) may crack away from both or either of its electrical contacts with the electrical connection means. These electrical contact faults or failures in the form of micro cracking are likely due to factors including the inevitable die size and plate thickness and flatness tolerances.

Baking/heating processing for the component fabrication is the source for thermal stresses to the structure of each and every component still uncut from its arrayed location. Within the mass array, each circuit die is placed into its assigned location to a tolerance, and the substrate at each die location has a thickness also to a tolerance. As thermal stresses arise from fabrication processing, the die height tolerance in the Z axis (perpendicular to the plane of the mass matrix) and the positional tolerance in the X-Y plane (of the matrix) for each circuit die, together, result into twisting stresses that can not be estimated in precision. Such stresses are the main cause for the undesirable micro cracking in the structure.

SUMMARY OF INVENTION

It is therefore an object of the present invention to provide a method of efficient high-speed fabrication that mass produces discrete circuit components at low costs that are free from the cracking damages arising from the thermal and/or mechanical stresses during the fabrication phase thereof.

It is another object of the present invention to provide a method of efficient high-speed fabrication that mass produces discrete circuit components at low costs that free from the cracking damages arising from the thermal and/or mechanical stresses during the service phase thereof.

In order to achieve the above-identified object, the present invention provides a discrete circuit component having an up-right circuit die with lateral electrical connections. The component comprises a substrate having a pair of electrically conductive traces, and a circuit die is planted between the pair of consecutive traces, wherein one electrode of the circuit die on the surface thereof vertical to the substrate is electrically bonded to one of the conductive trace immediately next thereto, while the other electrode of the circuit die on the opposite surface thereof vertical to the substrate is electrically bonded to the other of the pair of conductive traces immediately next thereto. A body of electrical insulation material hermetically seals the circuit die, and a pair of surface electrodes formed on the surface of the body of insulation material are each electrically connected to the corresponding one of the pair of electrically conductive traces extending from the circuit die.

The present invention also provides a process for fabricating a discrete circuit component having an up-right circuit die with lateral electrical connections that comprises the steps of (a), forming an array of a plurality of electrical conductive traces on the surface of a substrate; (b), planting one circuit die between each pair of consecutive ones of said conductive traces; (c), electrically connecting each electrode of each of said circuit dice on the corresponding one of both lateral sides of said circuit die onto the proximate one of said pair of conductive traces with an electrically conductive bonding material; and (d), covering and sealing each of said circuit dice.

BRIEF DESCRIPTION OF DRAWINGS

The above and other objects, features, and advantages of this invention will become apparent by way of the following detailed description of the preferred but non-limiting embodiments. The description is made with reference to the accompanying drawings in which.

DETAILED DESCRIPTION

FIGS. 1–8 of the accompanying drawings respectively illustrate a discrete circuit component in various views in selected process steps of the fabrication in accordance with a preferred embodiment of this invention. Each view illustrates the intermediate structural configuration of the inventive discrete component of the present invention as it is progressively constructed in the procedural steps of the inventive process.

Figure 1:
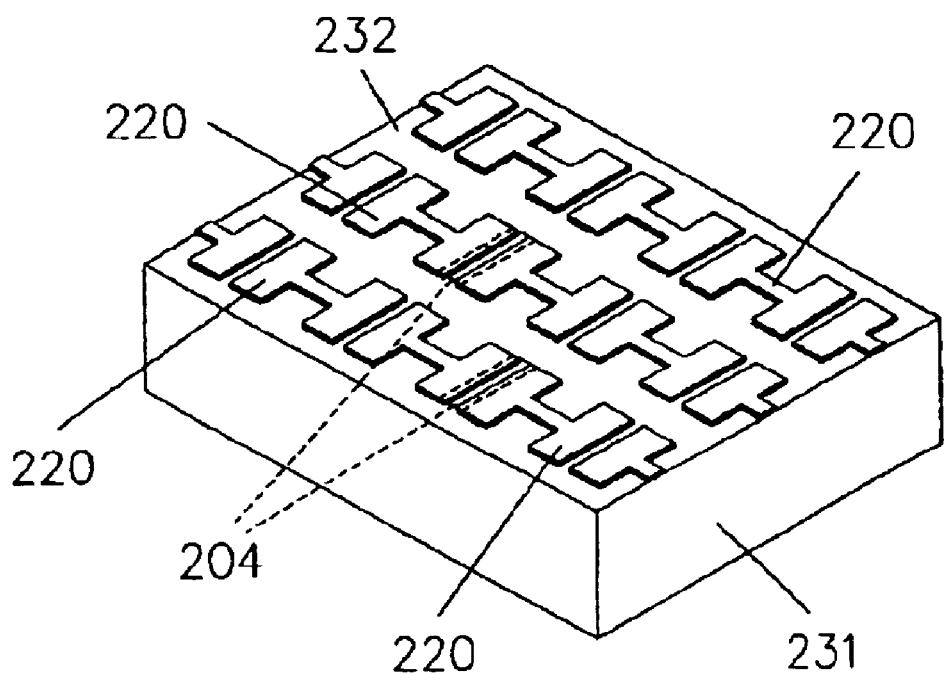
FIG. 1 is a perspective view showing the substrate for construction of the discrete circuit component in accordance with a preferred embodiment of the present invention.

FIG. 1 is a perspective view showing the substrate for construction of the discrete circuit component in accordance with a preferred embodiment of the present invention. The substrate 231 can be considered as the initial basis for the construction of the discrete circuit component of the present invention. It can be made of any material suitable. For example, based on considerations including the required circuit component electrical characteristics and costs etc., the substrate 231 can be made of ceramics, synthetic resin-based composite material, or other compounds.

The substrate 231 shown in FIG. 1 is a large substrate used as the basis on which discrete circuit components of the invention can be fabricated. It should be noted that, except in the final stage of the fabrication process, the substrate 231, in its entirety, serves as the basis for a number of circuit components, not just a single one. These many circuit components are formed progressively on the substrate as the fabrication process develops. At the beginning of the fabrication process, circuit components, in general, are aligned in an orderly manner over a large area on the surface of the substrate in, for example, a regular two-dimensional matrix of rows and columns. Each individual circuit component is separated from others only at the late stage of the manufacturing process by cutting the substrate 231.

As is illustrated in FIG. 1, electrically conductive traces 220 for the circuit components are first formed on one surface 232 of the substrate 231. Note that in this described embodiment, each of these conductive traces 220 has a generally H-shaped outline. However, as is comprehensible for those skilled in the art, conductive traces of other shapes are also applicable. For example, an alternate pattern is a pure rectangle, which features larger conductor cross-sectional area for power category of discrete components to be fabricated.

Between every pair of consecutive conductive traces 220, there is assigned a planting site for a circuit die, as is generally indicated by the phantom lines 204. This planting location can be recessed below the surface 232 of the substrate 231. For example, there can be formed a rectangular-shaped recess that fits the footprint of the circuit die to be planted, although not shown in the drawing. Or, the recess can be a continuous slot recessed into the surface 232 of the substrate 231 for dice planting of an entire column of components, as is the case of FIG. 2.

Depth of each recess 204 (when used) below the surface 201 of the substrate 200 can be selected to be a suitable fraction of, for example, about one-sixth to one-third, of the height of the circuit die to be planted in the up-right position into the recess 204. In a preferred embodiment, the substrate 231 can be made using suitable material by applicable method of, for example, molding. Such molding is suitable for the easy formation of the recesses 204. Further, the electrically conductive traces 220 can be formed of, for example, copper layer with adequate thickness and, if required, can be further coated with one or more other metals, as is known to those skilled in the art.

Figure 2:
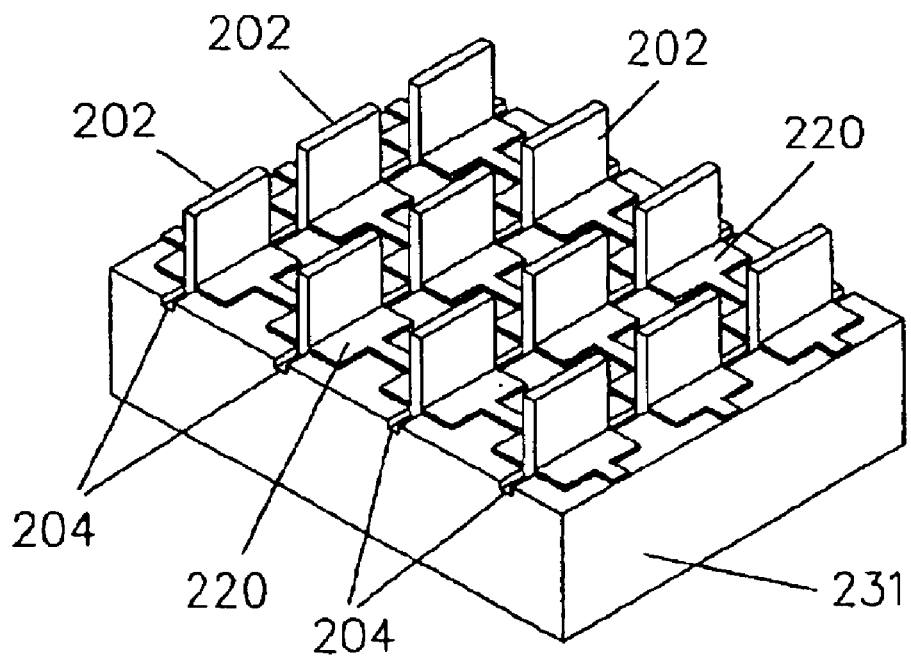
FIG. 2 is a perspective view showing an entire matrix of up-right circuit dice planted onto the surface of the substrate.

Then, using the substrate 231 of FIG. 1 as the basis, an entire matrix of circuit dice can be placed in position via a mass planting manipulation. The perspective view of FIG. 2 shows an entire matrix of up-right circuit dice 202 being planted onto the surface 232 of the substrate 231. Mass planting manipulation to properly align all circuit dice 202 into their corresponding locations on the substrate 231, as is comprehensible, can be achieved with suitable fixture in a few processing steps and will not be described herein.

Note, however, that the planting of each of the circuit dice 202 into its corresponding location on the substrate 231 inserts the desired edge of the die into the slot 204 recessed below the substrate surface 232. The mass plating also aligns all the dice into an orderly arrayed matrix, with each die 202 correctly placed between two consecutive electrically conductive traces 220.

Figure 3:
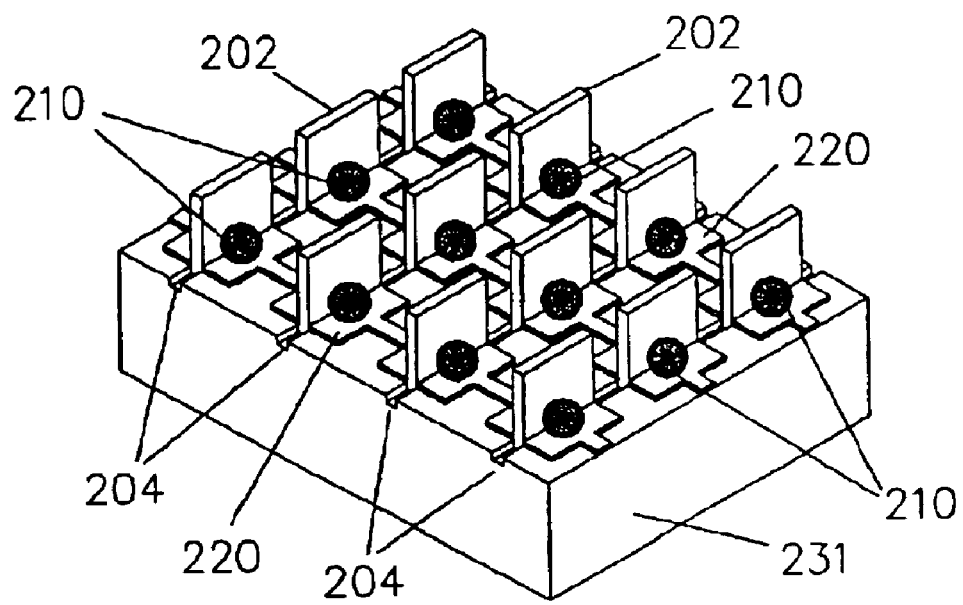
FIG. 3 is a perspective view showing the side-placement of soldering material for each planted circuit die.

After the correct placement of the circuit dice, electrical bonding material for each of the dice in the entire array is applied. FIG. 3 is a perspective view showing the side-placement of soldering material for each planted circuit die. Note that in this described embodiment the boding material is applied as solder balls 210, with one placed to each lateral side of every planted circuit die 202 although only one is visible in FIG. 3 due to the angle of view. As is comprehensible, other methods for applying the right amount of soldering material onto the designated locations, such as via solder paste applicator and screen-printing machine, are certainly also feasible.

Figure 4:
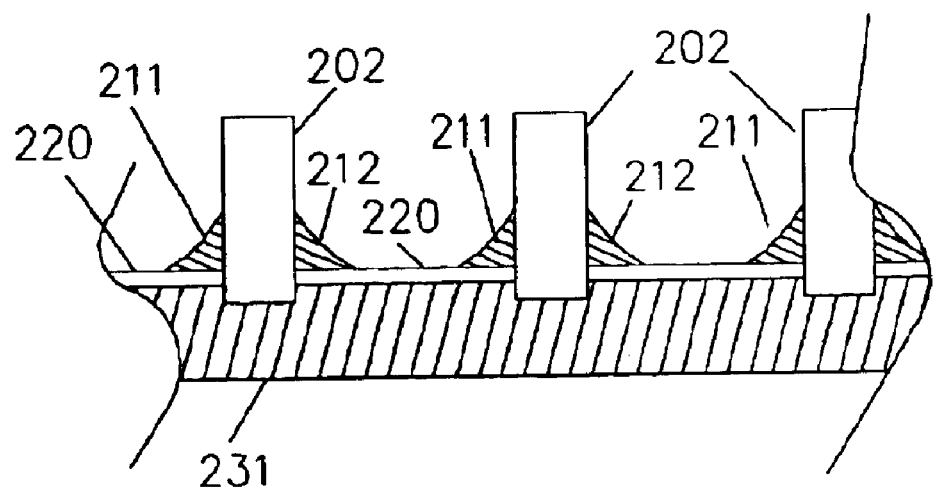
FIG. 4 is a cross-sectional view illustrating the soldering of an up-right-planted circuit die for fixedly attaching the die onto the substrate.

The substrate 231 of FIG. 3 with planted circuit dice 202 and their corresponding solder balls 210 is then processed, for example, in a heating scheme. The heating is so that the bonding material as applied connects the electrodes of each of the planted circuit dice to their corresponding conductive traces in a permanently fixed manner. FIG. 4 is a cross-sectional view illustrating the soldering of an up-right-planted circuit die via heating for fixedly attaching the die onto the substrate. In this soldering, each of both electrodes on the lateral vertical surfaces of a circuit die 202 is soldered to the horizontal conductive trace 220 immediately next to itself.

Figure 5:
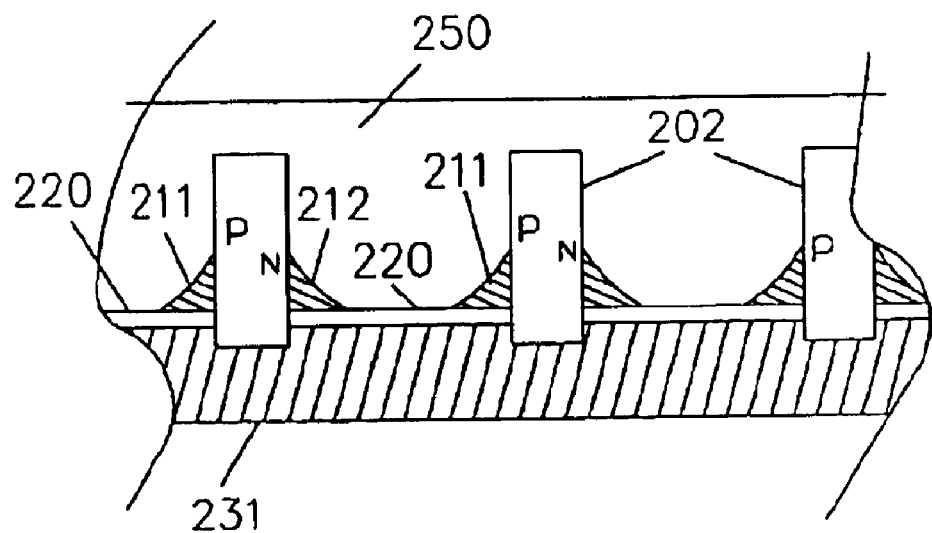
FIG. 5 is a cross-sectional view illustrating the covering by a sealing material of the circuit dice of FIG. 4.

After electrically connecting each of the circuit dice in the entire mass array to its conductive traces, the structure of FIG. 4 may then be enclosed in a protective insulation material for hermetically sealing circuit dice. The cross-sectional view of FIG. 5 illustrates the covering by a sealing material of the circuit dice of FIG. 4.

Figure 6:
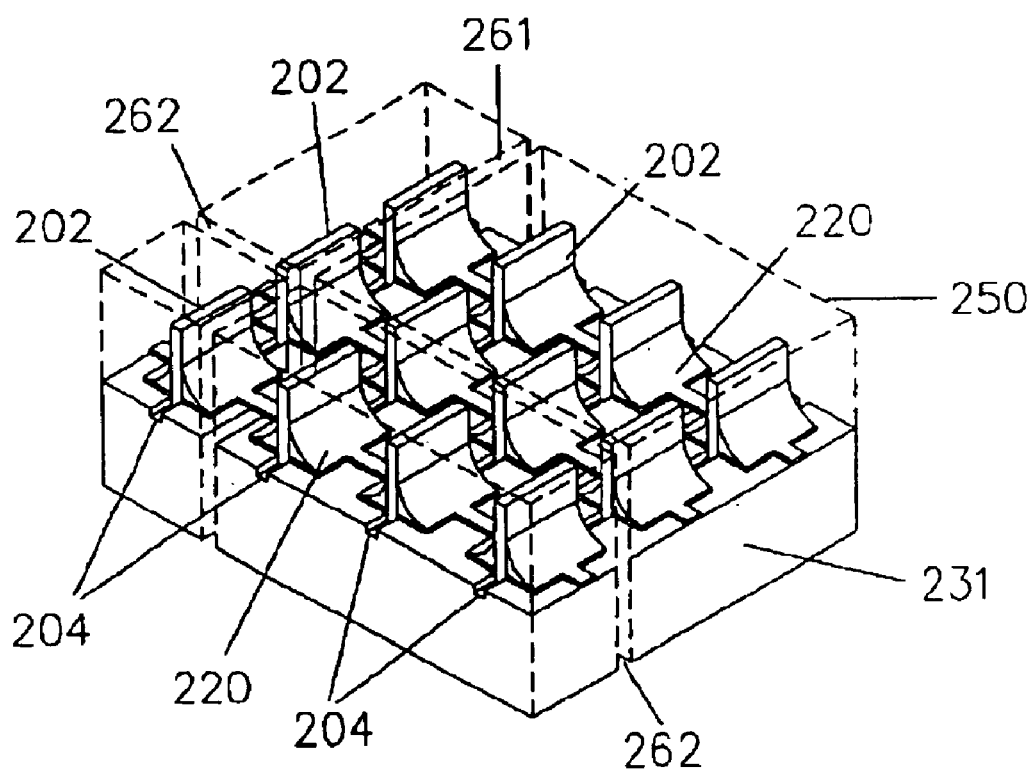
FIG. 6 is a perspective view showing the location of the cut between consecutive components when implementing component separation.

Complete with protective sealing, the entire array of discrete circuit components can then begin the processing including the formation of component electrodes and physical separation. As is comprehensible for those in the art, component electrodes can be made before or after the physical separation of the discrete bodies depending on the requirement of the fabrication procedural design, such as in the fabrication of terminal electrodes for the circuit dice in the manufacture of discrete resistors and capacitors. To implement discrete component separation, the entire structure of FIG. 5 can be submitted for row- and column-wise cutting, as is shown in FIG. 6. FIG. 6 is a perspective view showing the location of the row- and column-wise cuts 261 and 262 between consecutive components when implementing component separation. The perspective view indicates the location where the column-wise deep cuts for the fabrication surface electrodes and the subsequent row-wise deep cuts should be implemented.

Figure 7:
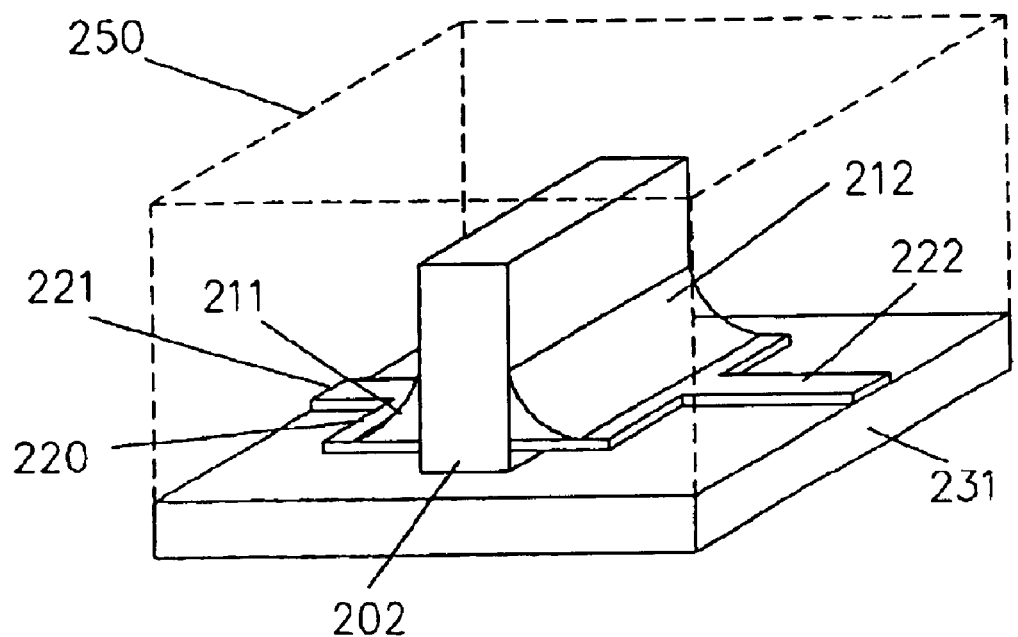
FIG. 7 is a perspective view showing details of the structural construction of a discrete circuit component in accordance with the preferred embodiment of the present invention after being separated from the mass array as an independent and final product.
Figure 8:
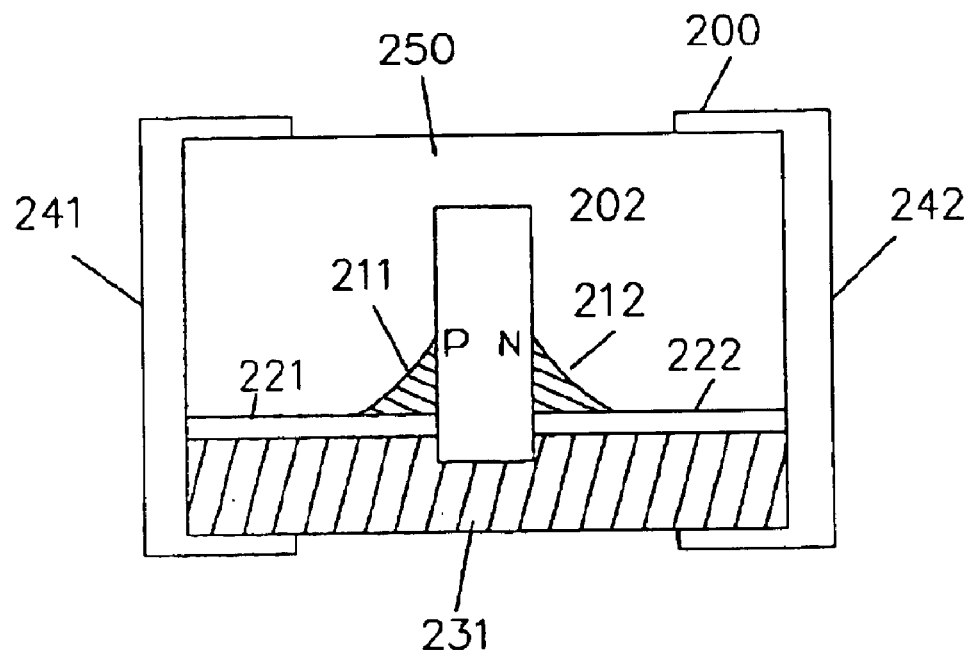
FIG. 8 is a cross-sectional view illustrating the structural configuration of a discrete circuit component having an up-right circuit die with lateral electrical connections in accordance with a preferred embodiment of the present invention.

Thus, what is shown in FIGS. 7 and 8 is a discrete circuit component having an up-right circuit die with lateral electrical connections in accordance with the teaching of the present invention. The component comprises a substrate 231 having a pair of electrically conductive traces 221 and 222, and a circuit die 202 is planted between the pair of consecutive traces, wherein one electrode of the circuit die 202 on the surface thereof vertical to the substrate 231 is electrically bonded to one of the conductive trace, 221 by the bonding material 211, immediately next thereto, while the other electrode of the circuit die 202 on the opposite surface thereof vertical to the substrate 231 is electrically bonded by the bonding material 212 to the other, 222, of the pair of conductive traces immediately next thereto. A body of electrical insulation material 250 hermetically seals the circuit die 202, and a pair of surface electrodes 241 and 242 formed on the surface of the body of insulation material are each electrically connected to the corresponding one of the pair of electrically conductive traces 221 and 222 extending from the circuit die 202.

FIG. 8 is a cross-sectional view illustrating the structural configuration of a discrete circuit component having an up-right circuit die with lateral electrical connections in accordance with a preferred embodiment of the present invention. The discrete component of the present invention has a single substrate that is used as the construction basis for the arrayed components, therefore the height of circuit die of the discrete component of the present invention does not impose any fabrication problem even if tolerance is severe. This is because there is no second substrate to place on top. Such a structure is less vulnerable to mechanical and thermal stresses than the prior-art structure.

Thus, what is shown in FIGS. 7 and 8 is a discrete circuit component having an right circuit die with lateral electrical connections in accordance with the teaching of the present invention. The component comprises a substrate 231 having a pair of electrically conductive traces 221 and 222, and a circuit die 202 is planted between the pair of consecutive traces, wherein one electrode of the circuit die 202 on the surface thereof vertical to the substrate 231 is electrically bonded to one of the conductive traces, 221, immediately next thereto, while the other electrode of the circuit die 202 on the opposite surface thereof vertical to the substrate 231 is electrically bonded to the other, 222, of the pair of conductive traces immediately next thereto. A body of electrical insulation material hermetically seals the circuit die 202, and a pair of surface electrodes 241 and 242 formed on the surface of the body of insulation material are each electrically connected to the corresponding one of the pair of electrically conductive traces 221 and 222 extending from the circuit die 202.

Figure 9:
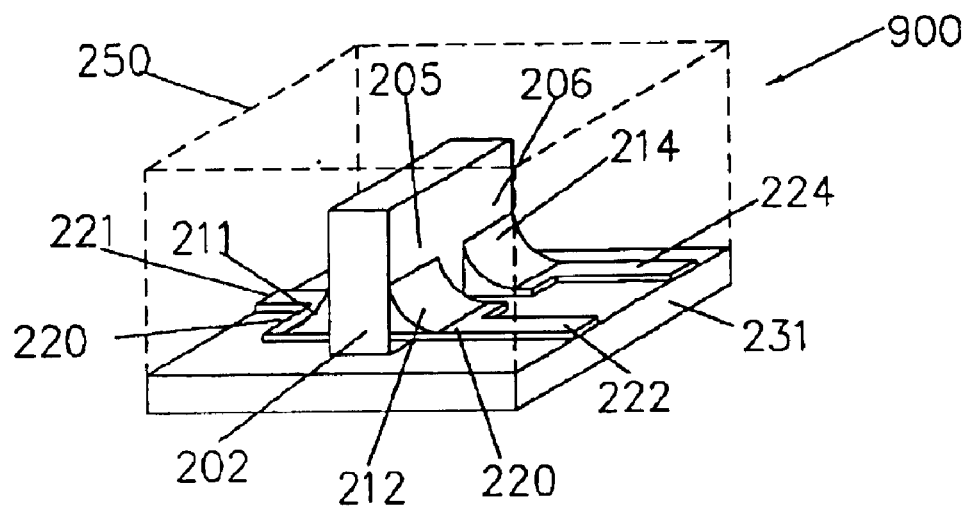
FIG. 9 is a perspective view illustrating details of the structural construction of a discrete circuit component having three electrical terminals in accordance with another preferred embodiment of the present invention.

While the above is a full description of a specific embodiment of the present invention, various modifications, alternative constructions and equivalents may be used. Also, although only the general and broad term of "discrete circuit components" has been used in the above descriptive paragraphs in the description of the preferred embodiment of the present invention, it is comprehensible for those skilled in the art that any discrete component of the SMT type complying to the EIA standard are certainly applicable to the invention. These include, but not limited to, two-terminal discrete components such as Zener and Schottky diodes, discrete capacitors of either polarity or non-polarity nature, discrete resistors, and even certain active components such as transistors. For example, three-terminal discrete transistor devices such as illustrated in FIG. 9 as well as active photo coupler devices with four or more terminals are also suitable to the present invention. The three-terminal discrete transistor 900 depicted in FIG. 9, as is illustrated, has three segments of internal conductive traces 221, 222 and 224. Via these traces, the transistor die 202 has its three terminals (including 205 and 206 identified) connected respectively to their corresponding external terminals not shown in the drawing.

Figure 10:
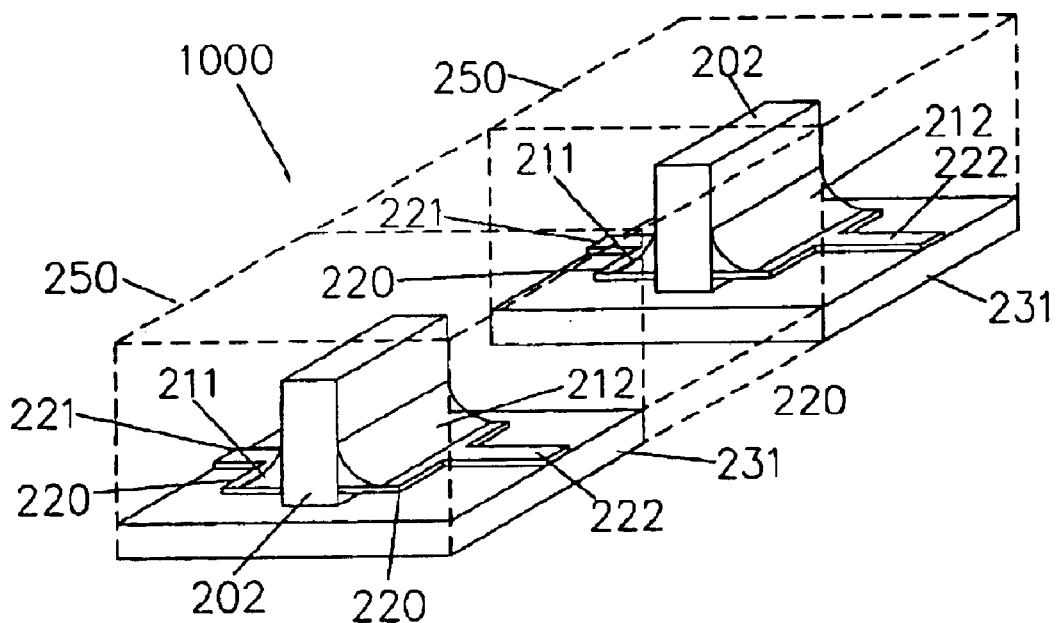
FIG. 10 is a perspective view showing a diode rack having a row of physically connected and electrically independent individual discrete components in accordance with an embodiment of the present invention.

More, the invention is not only applicable to those common 1210, 1206, 0805 and 0603 dimensions of the EIA standard components, those with even smaller dimensions that are not listed in EIA are also applicable. In fact, the invention is particularly suitable for miniaturized SMT devices. Further, a multiple of individual discrete circuit components made in accordance with the present invention but connected in a one-dimensional array such as arrayed diodes and arrayed transistors should also be considered in the scope of the present invention. The perspective view of FIG. 10 shows such a diode rack 1000, which, essentially, is a row of un-cut individual discrete components described above.

Also, although many circuit dice used for the production of discrete components are flat in structure that requires them to be erected in the up-right position if their electrodes are to be connected laterally, however, other circuits dice with less flatness should be considered to be within the scope of the present invention so long as lateral electrode connections are to be made. Therefore, the above description and illustrations should not be taken as limiting the scope of the present invention which is defined by the appended claims.

What is claimed is:

1. A discrete circuit component having an up-right circuit die with lateral electrodes, said component comprising:
    a substrate having a pair of electrically conductive traces;
    a circuit die planted between said pair of conductive traces, wherein one electrode of said circuit die on the surface thereof vertical to said substrate being electrically bonded to one of said conductive traces immediately next thereto, and the other electrode of said circuit die on the opposite surface thereof vertical to said substrate being electrically bonded to the other of said pair of conductive traces immediately next thereto;
    a body of electrical insulation material hermetically sealing said circuit die; and
    a pair of surface electrodes formed on the surface of said body of insulation material each electrically connected to the corresponding one of said pair of electrically conductive traces extending from said circuit die.

2. The discrete circuit component of claim 1, wherein the bottom surface of said circuit die planted onto the surface of said substrate is planted onto said substrate in a recess below said surface of said substrate.

3. The discrete circuit component of claim 1, wherein the bottom surface of said circuit die planted onto the surface of said substrate is planted onto said substrate in a groove recessed below said surface of said substrate.

4. The discrete circuit component of claim 1, wherein said electrodes of said circuit die are bonded to said conductive traces by solder balls.

5. A discrete circuit component having an up-right circuit die with a plurality of lateral electrodes, said component comprising:
   a substrate having a plurality of electrically conductive traces;
   a circuit die planted between said plurality of conductive traces, wherein each electrode of said circuit die on the lateral surface thereof vertical to said substrate being electrically bonded to the corresponding one of said conductive traces immediately next thereto;
   a body of electrical insulation material hermetically sealing said circuit die; and
   a plurality of surface electrodes formed on the surface of said body of insulation material each electrically connected to the corresponding one of said plurality of electrically conductive traces extending from said circuit die.

6. The discrete circuit component of claim 5, wherein said plurality of lateral electrical connections of said up-right circuit die comprises three or more lateral electrical connections.

7. A discrete circuit component rack having a plurality of discrete circuit components connected physically together in a row and electrically independent to each other, each of said discrete circuit components having an up-right circuit die with lateral electrical connections, said component comprising:
   a substrate having a pair of electrically conductive traces;
   a circuit die planted between said pair of consecutive traces, wherein one electrode of said circuit die on the surface thereof vertical to said substrate being electrically bonded to one of said conductive traces immediately next thereto, and the other electrode of said circuit die on the opposite surface thereof vertical to said substrate being electrically bonded to the other of said pair of conductive traces immediately next thereto;
   a body of electrical insulation material hermetically sealing said circuit die; and
   a pair of surface electrodes formed on the surface of said body of insulation material each electrically connected to the corresponding one of said pair of electrically conductive traces extending from said circuit die.

8. The discrete circuit component rack of claim 7, wherein the bottom surface of said circuit die planted onto the surface of said substrate is planted onto said substrate in a recess below said surface of said substrate.

9. The discrete circuit component rack of claim 7, wherein the bottom surface of said circuit die planted onto the surface of said substrate is planted onto said substrate in a groove recessed below said surface of said substrate.

10. The discrete circuit component rack of claim 7, wherein said electrodes of said circuit die are bonded to said conductive traces by solder balls.

11. A discrete circuit component rack having a plurality of discrete circuit components connected physically together in a row and electrically independent to each other, each of said discrete circuit components having an up-right circuit die with lateral electrical connections, said component comprising:
    a substrate having a plurality of electrically conductive traces;
    a circuit die planted between said plurality of conductive traces, wherein each electrode of said circuit die on the lateral surface thereof vertical to said substrate being electrically bonded to the corresponding one of said conductive traces immediately next thereto;
    a body of electrical insulation material hermetically sealing said circuit die; and
    a plurality of surface electrodes formed on the surface of said body of insulation material each electrically connected to the corresponding one of said plurality of electrically conductive traces extending from said circuit die.

12. The discrete circuit component rack of claim 11, wherein said plurality of lateral electrical connections of said up-right circuit die comprises three or more lateral electrical connections.

13. A process for fabricating a discrete circuit component having an up-right circuit die with lateral electrical connections comprising the steps of:
    (a) forming an array of a plurality of electrical conductive traces on the surface of a substrate;
    (b) planting one circuit die between each pair of consecutive ones of said conductive traces;
    (c) electrically connecting each electrode of each of said circuit dice on the corresponding one of both lateral sides of said circuit die onto the proximate one of said pair of conductive traces with an electrically conductive bonding material; and
    (d) covering and sealing each of said circuit dice.

14. The process for fabricating discrete circuit component of claim 13, wherein the bottom surface of said circuit die planted onto the surface of said substrate is planted onto said substrate in a recess below said surface of said substrate.

15. The process for fabricating discrete circuit component of claim 13, wherein the bottom surface of said circuit die planted onto the surface of said substrate is planted onto said substrate in a groove recessed below said surface of said substrate.

16. The process for fabricating discrete circuit component of claim 13, wherein said electrodes of said circuit die are bonded to said conductive traces by solder balls.

17. The discrete circuit component of claim 5, wherein said plurality of lateral electrical connections of said up-right circuit die are located two lateral sides of the circuit die.

* * * * *